United States Patent [19]
De Laune

[11] 3,944,925
[45] Mar. 16, 1976

[54] PHASE-LOCKED LOOP TRANSCEIVER HAVING AUTOMATIC FREQUENCY OFFSET SELECTABILITY

[75] Inventor: Jon M. De Laune, Tempe, Ariz.
[73] Assignee: Motorola, Inc., Chicago, Ill.
[22] Filed: Aug. 5, 1974
[21] Appl. No.: 494,782

[52] U.S. Cl. .................... 325/17; 325/20; 325/420; 329/126; 329/136; 331/1 A; 331/34
[51] Int. Cl.².......................................... H04B 1/40
[58] Field of Search .......... 325/17, 25, 3, 5, 9, 346, 325/351, 419–423, 18, 20, 416–418; 331/1 A, 36 R, 41, 34; 343/179; 329/122, 124, 126, 136, 178, 179

[56] References Cited
UNITED STATES PATENTS

| | | | |
|---|---|---|---|
| 3,551,826 | 12/1970 | Sepe | 331/1 A |
| 3,641,434 | 2/1972 | Yates | 325/25 |
| 3,801,925 | 4/1974 | Parkyn | 331/1 A |
| 3,803,495 | 4/1974 | Reynolds | 325/470 |

*Primary Examiner*—Albert J. Mayer
*Attorney, Agent, or Firm*—Harry M. Weiss; Kenneth R. Stevens

[57] ABSTRACT

This specification discloses a frequency synthesizer or phase-locked loop transceiver operating from a reference oscillator source, $F_{REF}$. A single phase-locked loop system for the transceiver includes counter means located in a feedback path connected between a voltage controlled oscillator (VCO) and a digital phase detector. The counter is preset to a predetermined number N for generating a frequency representation $$\frac{F_{OUT}}{N}.$$

The counter means includes logic and decoding circuitry for automatically modifying the $$\frac{F_{OUT}}{N}$$

signal representation by a factor M for generating a feedback signal $F_F$, where $F_F$ is $$\frac{F_{OUT}}{N \pm M}.$$

The feedback signal representation $$\frac{F_{OUT}}{N \pm M}$$

is applied to the digital phase detector for generating a transmit or receive signal $F_{OUT}$, where $F_{OUT} = F_{REF}{(N \pm M)}$.

8 Claims, 4 Drawing Figures

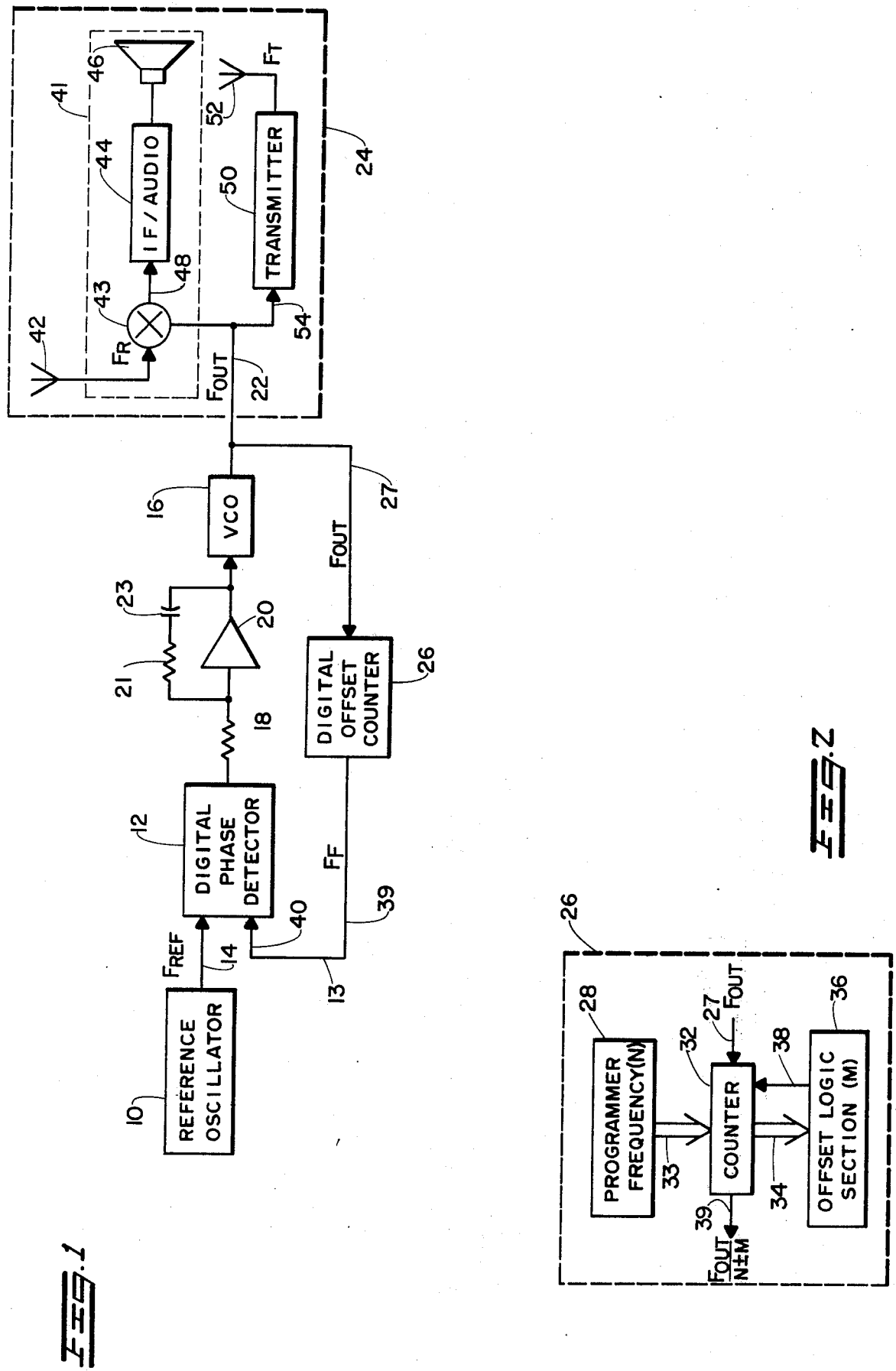

PHASE-LOCKED LOOP TRANSCEIVER HAVING AUTOMATIC FREQUENCY OFFSET SELECTABILITY

BACKGROUND OF THE INVENTION

1. Field of the Invention

This invention relates to the communication field, and more particularly to a phase-locked transceiver system.

2. Description of Prior Art

Basically, receiver-transmitter or transceiver units available in the past employ either an analog mixer or a frequency synthesizer approach, the latter approach sometimes being referred to as a phase-locked loop scheme. Illustrative of the analog approach, a radio frequency signal is combined with an intermediate frequency signal in an analog mixer. However, the analog mixer can often introduce deleterious noise excursions into the system thus limiting the overall quality of transmission or reception.

A primary reason for employing phase-locked loop systems or frequency synthesizers is to minimize the noise spurious response problems associated with the analog approach. The phase locked loop system essentially employs a reference oscillator, digital detector, active filter network, and a voltage controlled oscillator. A digital counter is connected in feedback relation between the voltage controlled oscillator and the digital phase detector. The digital phase detector compares the reference oscillator signal with the output from the digital counter for producing an error voltage which is applied to the VCO. The VCO generates a signal which is fed to the counter in order to generate a digital correction signal for the digital phase detector. Ideally, the system will reach a steady state wherein the two signals applied to the digital phase detector, that is the reference signal and the signal from the feedback counter are of identical phase and frequency. In some known prior art approaches of this type, both the transmit and receive sections of the system required their independent phase-locked loop system. Accordingly, a transceiver required two phase-locked loops or used an analog mixing approach.

It has been suggested to employ a single phase-locked loop system for a transceiver. However, known approaches using a single phase-locked loop system still suffer a major drawback. When it is desired to generate different transmit and receive frequency signals, it is necessary first to manually set the desired receive frequency into the system and during transmit resetting to the desired transmit frequency. For example, in a duplex or repeater mode of operation with a transceiver it is desirable to receive at a first predetermined frequency and to transmit at a second predetermined frequency where the receive frequency is offset from the transmit frequency a predetermined amount. Prior Art approaches require a person to manually select the transmit frequency in order to generate that desired frequency, and thereafter manually select or dial another setting in order to obtain the receive frequency.

SUMMARY OF THE INVENTION

It is therefore an object of the present invention to provide an improved phase-locked transceiver which is more economical, simpler to operate, and which contains a fewer number of components.

Another object of the present invention is to provide an improved phase-locked loop transceiver which is expandable, either by field wiring or memory implementation, in order to provide variable offset capabilities when used in a duplex or repeater mode.

Another object of the present invention is to provide a transceiver requiring only a single phase-locked loop which is capable of automatically providing any frequency offset from the digital number initially stored in the counter located in the feedback path.

In accordance with the aforementioned objects, the present invention comprises a transceiver having a single phase-locked loop system wherein the counter includes logic and decoding means for generating a control signal for the digital phase detector proportional to $N \pm M$, where N is any desired digital number representative of a desired frequency and M is any desired digital number representative of a frequency offset. The entire system is in turn responsive to the feedback control signal for generating any desired transmit or receive signals, $F_{OUT}$, where $F_{OUT} = F_{REF}(N \pm M)$.

BRIEF DESCRIPTION OF THE DRAWINGS

FIG. 1 shows a block diagram of the overall transceiver system.

FIG. 2 illustrates a block diagram of the digital counter subsystem and its associated logic and decoding circuitry, generally shown in FIG. 1.

DESCRIPTION OF THE PREFERRED EMBODIMENTS

Figure 3:
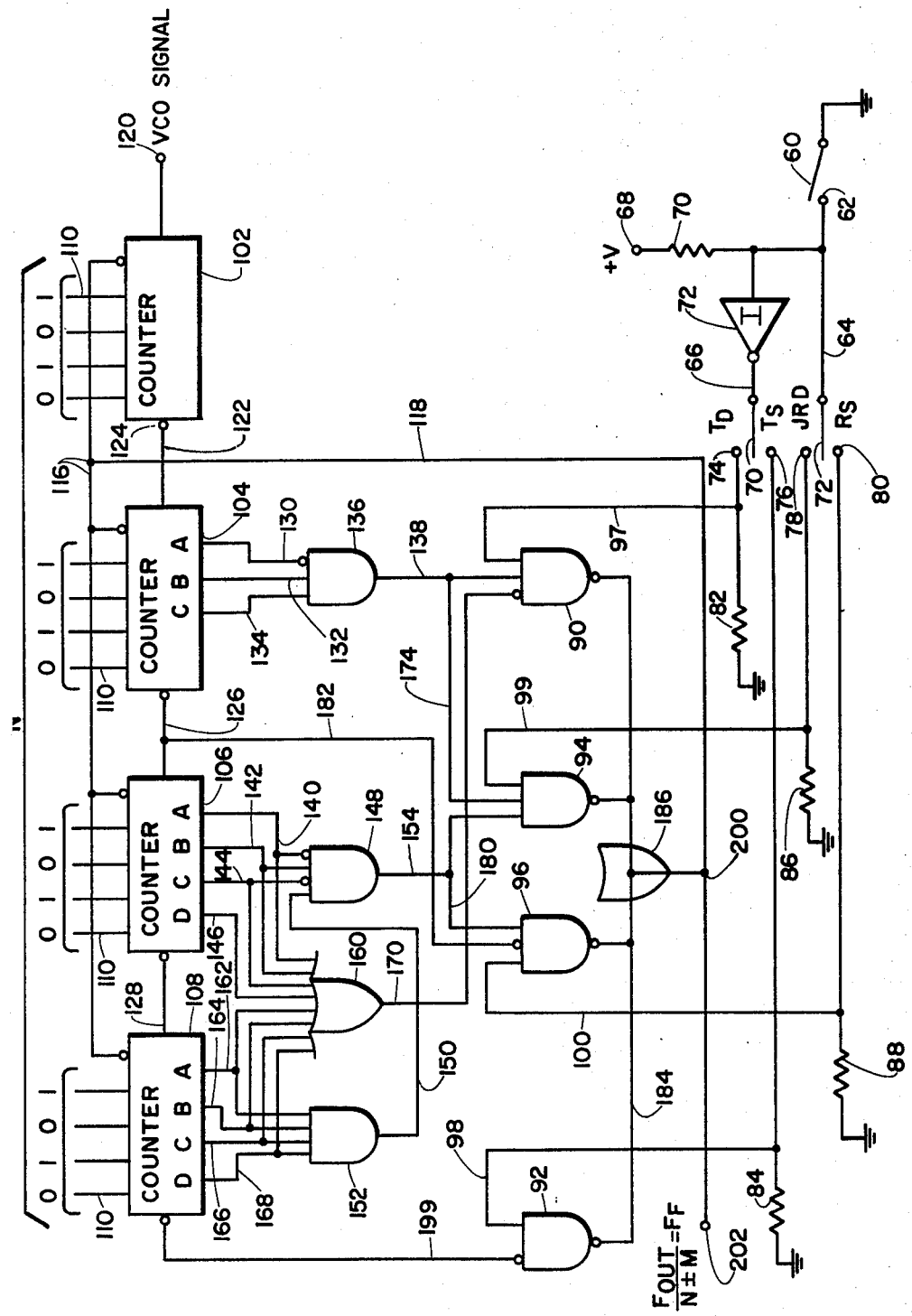
FIG. 3 illustrates one embodiment of the digital offset counter subsystem generally shown in FIG. 2 in block diagram.

Now referring to FIG. 1, it illustrates the general block diagram of the overall system it includes a reference oscillator 10 which generates a frequency reference signal $F_{REF}$ which is applied to a digital phase detector 12 by means of line 14. A suitable phase detector for the embodiment shown herein is commercially available and is designated by Motorola Part No. MC4044. In a conventional manner, the digital phase detector 12 compares the $F_{REF}$ signal with the signal received on its other input line 13 and generates an error voltage which is applied to a voltage controlled oscillator 16 (VCO) by means of the active filter circuit comprising resistor 18, operational amplifier 20, resistor 21, and capacitor 23. The VCO 16 provides an output signal $F_{OUT}$ on line 22 connected to the transceiver 24. Signal $F_{OUT}$ is also applied to a digital offset counter subsystem means 26 by way of line 27.

FIG. 2 illustrates in greater detail the basic components of the digital offset counter 26 and includes a program frequency load section 28 for writing the predetermined digital number N into a counter 32 by means of a plurality of lines schematically illustrated at 33. The output from the counter 32 is applied by means of a plurality of lines 34 to an offset logic section 36. A load command or counter write signal is generated in the offset logic section 36 and applied to counter 32 by means of line 38. The line 27 receives the $F_{OUT}$ signal from the VCO 16 which in conjunction with the load command signal received on line 38 controls the counting operation of counter 32. Counter 32 generates an output signal on line 39 and applies it to one of the input terminals 40 of phase detector 12. The output feedback signal representation on line 39 is $$F_F = \frac{F_{OUT}}{N \pm M}.$$

In a conventional manner, the transceiver section 24 further includes means to receive a signal via antenna 42 connected to the receiver mixer 43. In a receive mode of operation, the $F_{OUT}$ signal generated on line 22 is combined with a radio frequency signal $F_R$ received by antenna 40 and applied to a receiver unit 41 and combined in mixer 42 to produce an intermediate frequency which is applied to the intermediate frequency/audio section 44 and speaker 46 by means of line 48. Similarly, in a transmit mode of operation, the signal $F_{OUT}$ is applied to the transmitter section 50 by line 54 and amplified for generating a signal $F_T$ which is applied to antenna 42. The antennas 40 and 52 are usually the same structure with suitable switching for selecting the $F_R$ or $F_T$ mode.

Now referring to FIG. 3, it illustrates a specific implementation of the digital offset counter subsystem 26 shown in FIGS. 1 and 2. This embodiment is capable of generating a predetermined output frequency $F_{OUT}$ for either simplex or duplex modes of operation. This system is capable of operating in the following four different modes: transmit duplex, $T_D$; transmit simplex, $T_S$; receive duplex, $R_D$; and receive simplex $R_S$. In all receive modes, a switch 60 is disconnected from terminal 62 so as to place a logic high or binary one level on line 64, and to simultaneously place line 66 at a logic low or binary zero level by means of the voltage source +V connected to terminal 68, resistor 70, and inverter 72. In all transmit modes of operation, switch 60 is connected to terminal 62 so as to raise line 66 to a logic high or binary one state and simultaneously place line 64 to a logic low or binary zero state. Switches 70 and 72 are selectively moved to contact one of the terminals 74 or 76 and 78 or 80 in order to further select either $T_D$ or $T_S$ and $R_D$ or $R_S$ mode of operation. A plurality of logic level biasing resistors 82, 84, 86, and 88 are connected to terminals 74, 76, 78, and 80, respectively. A plurality of NAND gates 90, 92, 94, and 96 are connected to terminals 74, 76, 78, and 80 by means of lines 97, 98, 99, and 100, respectively.

The number N is selectively loaded into a plurality of separate counter stages 102, 104, 106, and 108 by means of their associated plurality of input lines generally designated at 110. In the specific operational example hereinafter described, a number representing a transceiver frequency of 55.55MHz is loaded into the plurality of counter stages in binary format, with counter 108 containing the most significant digit. Thus, the binary designations, as indicated in FIG. 3, are applied to the respective plurality of input terminals 110 in order to store N = 5555 therein. In this embodiment, counter stage 108 is constituted by a binary counter capable of counting between 0 to 15 in binary notation. The other stages 102, 104, and 106 comprise binary code decimal (BCD) counters capable of counting in binary coded decimal notation from 0 to 9. However, this is not a limitation on the present invention and the counters can be implemented in numerous configurations to handle a N number of ay magnitude and any binary format such as BCD, octal, hexidecimal. The specific implementation described herein is for purposes of simplicity and ease of explanation The digital representations received by the plurality of input terminals 110 are asynchronously loaded into the plurality of counter stages by means of a line command or write control signal applied to node 116 by means of line 118. This line was previously shown in FIG. 2 as line 38. Subsequent to the digital information being loaded into the plurality of counters 102, 104, 106, and 108 and upon the coincidence of the next VCO signal received at terminal 120, the least significant counter stage 102 begins counting. After counting to a binary coded decimal 9 notation all states of counter 102 reside in a binary zero state and a signal is applied to output line 122. A circular schematic designation 124 existing at the output of counter 102 indicates a logical invert function and thus a carry output signal generated from counter 102 onto line 122 will be logically low or enabled during a count carry condition from counter 102. Similarly, counter 104 supplies a logic low count start or carry enable signal to counter stage 106 by means of line 126, and counter 106 supplies a count initiate signal to counter 108 by means of line 128 in a manner similar to that described with respect to counters 102 and 104.

Counter 104 selectively generates logical representations A, B, and C on its respective output lines 130, 132, and 134, respectively. These output lines provide gating signals to AND gate 136 connected thereto. Thus, an output binary 1 signal is generated on output line 138 when the output terminals to AND gate 136 reside in a C·$\overline{B}$·$\overline{A}$ logical state, otherwise AND gate 136 is disabled.

Similarly, counter stage 106 provides logical signals A, B, C, and D on output lines 140, 142, 144, and 146. An AND gate 148 is connected to receive the A, B, C digital representations from counter 106. The other input terminal to AND gate 148 is connected to the output terminal of AND gate 152. Thus, AND gate 148 is enabled to provide a binary 1 or logic high signal on its output line 150 is in a binary 1 or high state and lines 140, 142, and 144 are in a $\overline{A}$, B, and $\overline{C}$, logical state, respectively.

An OR circuit 160 is connected at its input terminals to receive the logical signals generated on lines 140, 142, 144, and 146. Similarly, the OR circuit 160 is adapted to receive the A, B, C, and D generated on output lines 162, 164, 166, and 168 from counter stage 108. Similarly, the AND gate 152 is connected at its input terminals to the output lines from counter 108 and is enabled to provide a binary 1 or high output signal on line 150 for a A, B, C, and D logical state of counter 108. The output signal from OR gate 160 is applied by means of line 170 as an input to NAND gate 90. Also, NAND gate 90 is connected to receive logical input signals at its input terminals via lines 97 and 138. The center input terminal of NAND gate 94 is connected to the output of AND gate 136 by means of line 174, and its right-hand input terminal is connected to terminal 78 by means of line 99. Common line 180 connects the output of AND gate 148 to input terminals of NAND gates 94 and 96. Also, NAND gate 96 is connected to the output line 126 of counter 104 by means of line 182. Line 199 connects the output of counter 108 to NAND gate 92. The output terminals of NAND gates 90, 92, 94, and 96 are connected by common line 184 to wire OR'ed logic gate 186 in order to provide a pulse output at node 200. Node 200 is connected to the counter output terminal 202 which corresponds to terminal 39 shown in FIGS. 1 and 2 and it receives a generated pulse signal $$F_R = \frac{F_{OUT}}{N \pm M}.$$

Figure 4:
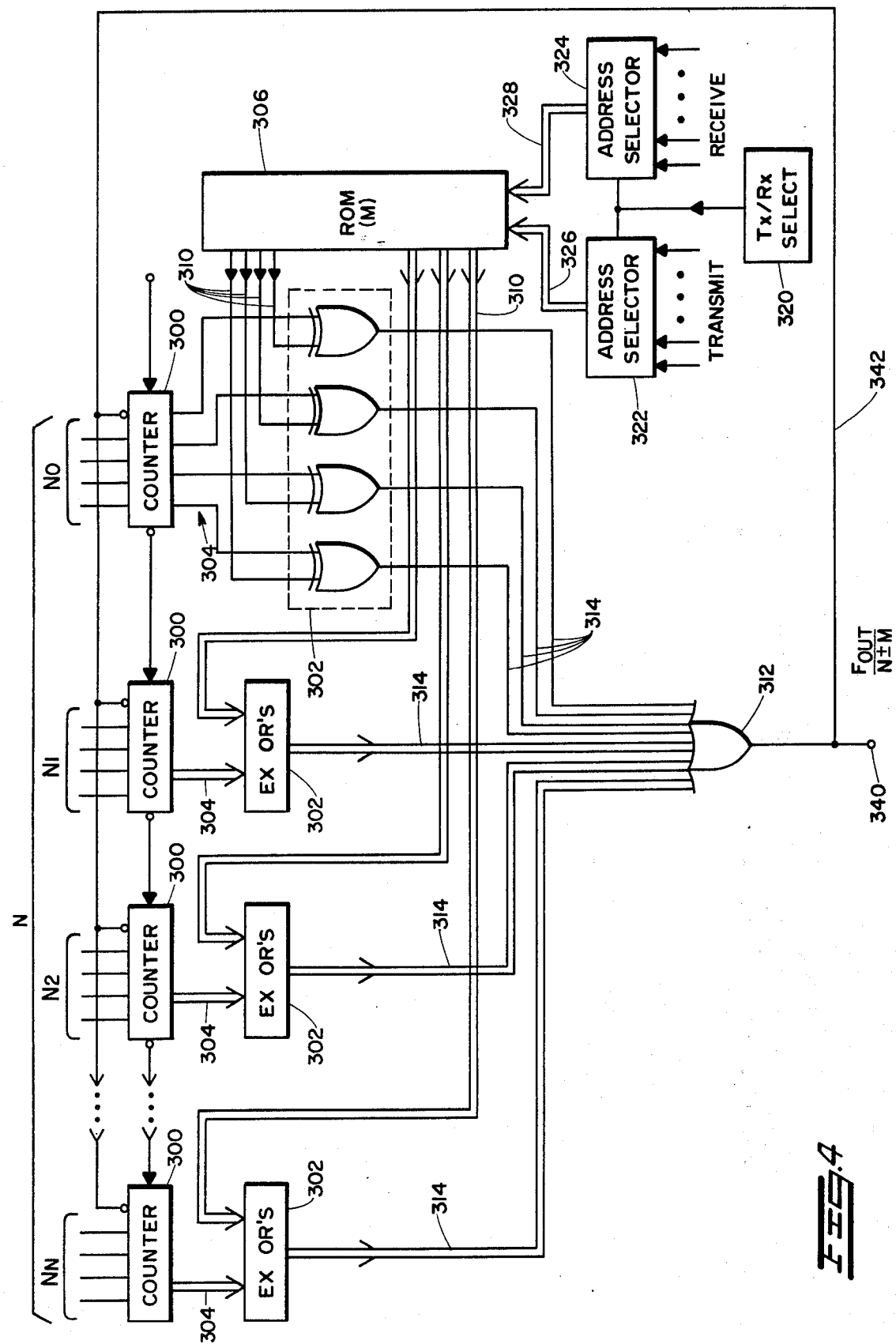
FIG. 4 illustrates another embodiment of the digital offset subsystem generally shown in FIG. 2 in block diagram, and which further includes a read only memory (ROM) for universally expanding the offset capability of the overall system.

Now referring to FIG. 4, it illustrates a more universal system having the capability of receiving or accommodating any desired number N and any desired number M. As previously discussed, the FIG. 3 embodiment was directed to four modes to operation; $T_D$, $T_S$, $R_D$, and $R_S$. But nonetheless, it is to be understood that the FIG. 4 embodiment basically operates in the same manner as that described with respect to the FIG. 3 embodiment.

A plurality of counter stages generally designated at 300 are capable of receiving any desired $N_0 \ldots N_N$ input number. The digital representations from the plurality of counters 300 are selectively connected to a plurality of respective exclusive-OR circuits generally shown at 302 by means of a plurality of output lines generally designated at 304. The plurality of exclusive-OR circuits or gates 302 also receive selecive gating signals from read only memory (ROM) 306 by means of lines generally depicted at 310. Similarly, the plurality of output lines from the plurality of exclusive-OR circuits 302 are connected to an OR circuit 312 by means of a plurality of associated output lines generally designated at 314. A transmit/receive ($T_X/R_X$) select unit 320 in conjunction with a transmit address selector unit 322 and receive address selector 324 generate addressing signals on lines 326 and 328 in order to selectively read control information from the ROM storage device 306. The ROM storage device in conjunction with the exclusive-OR circuits 302 enable any decoding pattern to be selected in order to allow the number M to be varied as desired in order to generate an output signal $$\frac{F_{OUT}}{N \pm M}$$

on an output terminal 340. In a manner similar to that described with the embodiment of FIG. 3, a counter load or write command signal is applied to the plurality of counter stages via line 342.

OPERATION

The operation of the invention is explained in conjunction with FIG. 3. In this embodiment, the counter is initially loaded with a program number N = 5555 representing a transceiver frequency of 55.55MHz. The mode of operaton is selected by the switch 60, and the offset modes are selected by the operation of switches 70 and 72. For example, a $R_S$ offset mode is activated by contacting switch 72 to terminal 80. The decoding or logic circuitry connected to the plurality of counter stages 102, 104, 106, and 108 is responsive to the digital representation M for generating an offset requirement of 8MHz, i.e., M = +800. Likewise, in the $R_D$ mode of operation the received frequency is offset from the transmit frequency by an additional 600KHz for duplex or repeater operation. In this instance, M = [+800 + (−60)] = +740. Similarly, $T_S$ is a non-offset mode of operation where the frequency is exactly equal to N, that is, M = zero for simplex or non-repeater transmitter operation. The last mode of operation, $T_D$, covers the case where the transmitter frequency is offset for duplex or repeater operation and M = −600KHz.

In the $R_S$ mode, switch 60 is open and switch 72 contacts terminal 80 and thus line 64 is high and line 66 low. Accordingly, line 100 is high and lines 97, 98, and 99 are low. Therefore, NAND gate 96 is being enabled and the other NAND gates 90, 94, and 92 are disabled. Another input to NAND gate 96 is provided by line 182 connected to the output of counter 104. When both counter stages 102 and 104 have counted down to a zero state line 182 goes to a logic low state to partially enable NAND gate 96. Finally, the remaining input to NAND gate 96 is provided by means of line 180 and requires a high logic output from AND gate 148. AND gate 148 provides a high logic output when counter stage 106 counts down to the digital notation 010 (binary 2) or logically $\overline{C} \cdot B \cdot \overline{A}$ simultaneously with line 150 also going to a high state as a result of AND gate 152 being enabled by counter stage 108 counting down through zero and back up to a count of 1111 or a logical state of D·C·B·A.

Thus, in this $R_S$ mode of operation the original number N is modified or offset and thus N + M = 5555 + (16000 −15260) = 5555 + 800 = 63555. Accordingly, with $F_{OUT}$ = 63.55MHz an oscillator injection signal is generated for mixer 42. The frequency received by antenna 42 is equal to the injection frequency 63.55MHz minus the receiver IF frequency, 8. MHz, or 63.55MHz −8.0MHz, 55.5MHz, the same signal representation (N) as originally loaded into the plurality of counter stages 102, 104, 106, and 108.

In the receive duplex $R_D$ mode, the system operates in a similar fashion to the $R_S$ mode except the oscillator injection frequency is shifted to a lower frequency by 600KHz in order to receive a repeater radio signal that is transmitted 600KHz higher in frequency than it receives. In the logical manner as previously discussed, NAND gate 94 is enable. The AND gate 148 connected thereto decodes thereto decodes the same number that it decoded for the $R_S$ mode of operation. Furthermore, AND gate 136 is enabled when the output from counter 104 resides in a $C \cdot B \cdot \overline{A}$, logical state in response to the carry forward signal generated on line 122. Therefore, in this instance, the decoded number in 15260 which results in an offset of 5555 + (16000 −15260) = 5555 + 740 = 6295. Thus, the oscillator injection frequency $F_{OUT}$ is now 62.95MHz thus providing an offset lower by 600KHz from the normal received frequency of 55.55MHz, that is a − 0.6MHz shift.

During a transmit mode of operation, $T_D$, a negative offset is produced. Switch 60 is connected to terminal 62 and switch 70 is connected to terminal 74 in order to enable NAND gate 90 via line 97. The center input of NAND gate 90 is enabled by a high state being generated on line 138 and a down or binary zero state being generated from OR gate 160 via line 170. The OR gate 160 decodes the zero states of counter 106 and 108. Accordingly, NAND gate 90 is enabled at a down count of 0060 or 60 counts earlier than zero and thus M = −600KHz. Finally, in the transmit simplex mode of operation, $T_S$, swtich 60 is connected to terminal 62 and switch 70 is connected to terminal 76. In this instance, the plurality of counter stages 102, 104, 106, and 108 decode or produce an output pulse on terminal 202 when they all reside in a 0000 logical state. In this instance, the transmitter 50 will transmit at the programmed frequency of N ±M where M = zero and N = 5555, representing a transmitted frequency $F_T$ = 55.55MHz.

As previously detailed, the FIG. 4 embodiment provides a ROM logic device 306 which is capable of selectively providing any desired offset M in either a transmit receive mode. The operation of the FIG. 4 embodiment is similar to that previously described with respect to FIG. 3 except in this instance all the desired values of M are stored in ROM device 306. The outputs on the plurality of lines 310 from the ROM device 306 provide logic gating signals to their respective exclusive-OR circuits 302 in order to selectively invert or not invert the output logical states received from their respective counters via the plurality of lines 304. Thus, an infinite number of decodes are provided. When all the outputs of exclusive-OR circuits are in a low state, the OR gate will also go low thus providing an output signal every N ± M times and also a load or write command to the counters via line 342 to reload the number N therein.

The address selector units 322 and 324 provide a specific address to the ROM device 306 and either the transmit address selector 322 or the receive address selector 324 units are selected by means of the unit 320.

What is claimed is:
1. A phase-locked loop system for generating an output signal $F_{OUT}$ from any first predetermined frequency varying signal N and any second frequency varying signal M offset from said first predetermined frequency varying signal a predetermined amount in response to a reference signal $F_{REF}$ comprising:
   a. a phase-locked loop means having a feed forward path including a phase detector and a voltage controlled oscillator and a feedback path coupled between a first input terminal means and an output terminal means and being responsive to the signal $F_{REF}$ for generating the signal $F_{OUT}$ at said output terminal;
   b. said phase-locked means further including counter means coupled between said input and said output terminals in said feedback path;
   c. said counter means including means for programming a selective digital representation of N and means for generating the offset digital frequency M and storing a digital frequency representation N ± M said counter being responsive to $F_{OUT}$ and said digital representation N ± M for generating $F_F$, where $F_F$ is

$$\frac{F_{OUT}}{N \pm M}$$

2. A phase-locked loop system for generating an output signal $F_{OUT}$ from any first predetermined frequency varying signal N and any second frequency varying signal M offset from said first predetermined frequency varying signal a predetermined amount in response to a reference signal $F_{REF}$ as in claim 1 wherein:
   a. said counter means comprises a programmable counter means having first input means for storing a digital representation N and second input means for receiving a digital representation of M for altering paid programmable counter to N ± M.

3. A phase-locked loop system for generating an output signal $F_{OUT}$ from any first predetermined frequency varying signal N and any second frequency varying signal M offset from said first predetermined frequency varying signal a predetermined amount in response to a reference signal $F_{REF}$ as in claim 1 wherein:
   a. said counter means comprises a plurality of stages and decoding logic means coupled thereto and being responsive to a digital representation of N.

4. A phase-locked loop system for generating an output signal $F_{OUT}$ from any first predetermined frequency varying signal N and any second frequency varying signal M offset from said first predetermined frequency signal a predetermined amount in response to a reference signal $F_{REF}$ as in claim 3 wherein:
   a. said decoding logic means includes a plurality of logic gates and switch means coupled thereto,
   b. said switch means being responsive to said digital representation of M for generating gating signals for controlling said plurality of logic gates in order to vary the value of N ± M.

5. A phase-locked loop system for generating an output signal $F_{OUT}$ from any first predetermined frequency varying signal N and any second frequency varying signal M offset from said first predetermined frequency signal a predetermined amount in response to a reference signal $F_{REF}$ as in claim 4 wherein:
   a. said decoding logic means further includes memory means coupled to said switch means for varying said digital representation of M.

6. A phase-locked loop system for generating an output signal $F_{OUT}$ from any first predetermined frequency varying signal N and any second frequency varying signal M offset from said first predetermined frequency signal a predetermined amount in response to a reference signal $F_{REF}$ as in claim 1 further comprising:
   a. transmitter and receiver means coupled to said phase-locked loop means for providing a transceiver system.

7. A phase-locked loop system for generating an output signal $F_{OUT}$ from any first predetermined frequency varying signal N and any second frequency varying signal M offset from said first predetermined frequency signal a predetermined amount in response to a reference signal $F_{REF}$ as in claim 2 further comprising:
   a. transmitter and receiver means coupled to said phase-locked loop means for providing a transceiver system.

8. A phase-locked loop system for generating an output signal $F_{OUT}$ from any first predetermined frequency varying signal N and any second frequency varying signal M offset from said frist predetermined frequency signal a predetermined amount in response to a reference signal $F_{REF}$ as in claim 4 further comprising:
   a. transmitter and receiver means coupled to said phase-locked loop means for providing a transceiver system.

* * * * *

UNITED STATES PATENT AND TRADEMARK OFFICE
CERTIFICATE OF CORRECTION

PATENT NO. : 3,944,925
DATED : March 16, 1976
INVENTOR(S) : Jon M. DeLaune

It is certified that error appears in the above–identified patent and that said Letters Patent are hereby corrected as shown below:

In Claim 1, column 7, line 52; add --and-- after "M".

In Claim 1, column 7, line 52; add --means-- after "counter".

In Claim 2, column 8, line 5; change "paid" to --said--.

Signed and Sealed this fifteenth Day of June 1976

[SEAL]

Attest:

RUTH C. MASON
Attesting Officer

C. MARSHALL DANN
Commissioner of Patents and Trademarks